(12) United States Patent
Tyan et al.

(10) Patent No.: US 8,395,946 B2
(45) Date of Patent: Mar. 12, 2013

(54) DATA ACCESS APPARATUS AND ASSOCIATED METHOD FOR ACCESSING DATA USING INTERNALLY GENERATED CLOCKS

(75) Inventors: Eer-Wen Tyan, Hsinchu Hsien (TW); Ming-Chieh Yeh, Hsinchu Hsien (TW); Yi Ling Chen, Hsinchu Hsien (TW)

(73) Assignee: MStar Semiconductor, Inc. (TW)

( * ) Notice: Subject to any disclaimer, the term of this patent is extended or adjusted under 35 U.S.C. 154(b) by 197 days.

(21) Appl. No.: 12/968,719

(22) Filed: Dec. 15, 2010

(65) Prior Publication Data

US 2011/0158005 A1 Jun. 30, 2011

(30) Foreign Application Priority Data

Dec. 29, 2009 (TW) ................................ 98145585 A

(51) Int. Cl.
*G11C 7/22* (2006.01)

(52) U.S. Cl. ......... 365/189.15; 365/189.17; 365/189.05; 365/189.07; 365/227; 365/233.11; 365/233.12; 365/233.13; 365/233.17; 365/233.18; 365/193; 365/194

(58) Field of Classification Search ............. 365/233.11, 365/233.12, 233.13, 233.17, 233.18, 233.1, 365/193, 194, 191, 189.15, 189.17, 189.05, 365/189.07, 227

See application file for complete search history.

(56) References Cited

U.S. PATENT DOCUMENTS

| 8,184,490 B2* | 5/2012 | Wang et al. | 365/189.15 |
| 2009/0040806 A1* | 2/2009 | Albasini et al. | 365/145 |
| 2010/0128506 A1* | 5/2010 | Yamada | 365/51 |

\* cited by examiner

*Primary Examiner* — Andrew Q Tran
(74) *Attorney, Agent, or Firm* — Andy M. Han; Han IP Law PLLC

(57) ABSTRACT

The data access apparatus comprises a phase locked loop (PLL) and a data receiving circuit. The PLL provides a plurality of internal clocks and selecting a strobe clock from the plurality of internal clocks according to a phase selection signal. The data receiving circuit comprises a latching module, for latching of the data signal according to trigger of the strobe clock and a calibrating circuit, for generating the phase selection signal for matching the data with a predetermined data according to the plurality of internal clocks in a training mode and finally determining the phase selection signal corresponding to a preferred clock used in a normal mode.

19 Claims, 4 Drawing Sheets

DATA ACCESS APPARATUS AND ASSOCIATED METHOD FOR ACCESSING DATA USING INTERNALLY GENERATED CLOCKS

CROSS REFERENCE TO RELATED PATENT APPLICATIONS

This patent application claims priority from Taiwan Patent Application No. 098145585, filed in the Taiwan Patent Office on Dec. 29, 2009, entitled "Data Access Apparatus and Associated Method for Accessing Data Using Internally Generated Clocks", and incorporates the Taiwan patent application in its entirety by reference.

TECHNICAL FIELD

The present disclosure relates to a data access apparatus and associated method for accessing data using internally generated clocks, and more particularly, to a data access apparatus and associated method for accessing data using internally generated clocks instead of external data strobe signals.

BACKGROUND OF THE PRESENT DISCLOSURE

A data access/exchange function is a most important and basic function of an electronic apparatus. One of important issues researched by modern circuit designers is how to realize high-speed data access/exchange and ensure accuracy of data exchange via simple, low-cost and small size configuration circuits.

Generally, a digital data source, e.g., a memory, is used for transmitting and receiving data signals according to a data strobe signal. A data access apparatus samples data signals according to the data strobe signal. For example, when a data receiving circuit of the data access apparatus accesses a DDR memory, which not only provides a data signal carrying data, but also provides an in-phase data strobe signal. Transitions of the data strobe signal are aligned with those of data signal. In prior arts, the data receiving circuit of the data access apparatus triggers sampling of the data signal according to the transitions (i.e., rising edges and/or falling edges) of the external data strobe signal. Although the data strobe signal and the data signal are in-phase, data of the data signals are preferably accessed when the data signal between two transitions is sampled. In other words, a preferred sampling timing of the data signal is that there is a phase difference of 90 degrees between rising/falling edges of the data signal and those of the data strobe signal. Therefore, a delay locked loop (DLL) is additionally configured in a conventional data receiving circuit to delay the external data strobe signal (i.e., the data strobe signal provided by the DDR memory) by 90 degrees, and the delayed data strobe signal triggers sampling of the data signal.

The conventional DLL is formed by a two-stage master-slave DLL comprising circuits having extremely complicated structures and operations, requiring large size layout area and consuming more system resources (e.g., power) when the circuits are operated. In addition, the data strobe signal is not a free-running clock. When the data signal carries data bits, transitions of the data bits are marked by level transitions of the data strobe signal. When the data signal does not carry data bits, the level of the data strobe signal stays unchanged. Therefore, when the data signal begins carrying data bits, the conventional DLL needs to immediately overcome a transition status caused by variation of the data strobe signal and stabilize operations to stably delay the data strobe signal by 90 degrees in real-time. However, as requirements of high-speed data access/exchange increase day by day, the data transmission frequency become faster and faster, and the DLL become harder and harder to respond and is only stabilized after several cycles. During the transition period, the conventional data receiving circuit cannot accurately samples actual content of the data bits. For the DDR memory that continuously transmits the data bits via a burst mode, the foregoing disadvantages become more obvious.

SUMMARY OF THE PRESENT DISCLOSURE

Therefore, the present disclosure provides a data access apparatus for accessing data via internal clocks instead of external data strobe signals and associated method to realize data access/exchange via simple, low-size configuration, low power-consuming, high-accuracy techniques.

One object of the present disclosure is to provide a data access apparatus for accessing a memory that provides a data signal to the data access apparatus. The data access apparatus comprises a phase locked loop (PLL) and a data receiving circuit. The PLL provides a plurality of internal clocks and selecting a strobe clock from the plurality of internal clocks according to a phase selection signal. The data receiving circuit comprises a latching module, for latching of the data signal according to trigger of the strobe clock and a calibrating circuit, for generating the phase selection signal for matching the data with a predetermined data at the plurality of internal clocks in a training mode and finally determining the phase selection signal corresponding to a preferred clock used in a normal mode.

Another object of the present disclosure is to provide a method for accessing a memory. The method comprises providing a plurality of internal clocks; determining a preferred clock from the plurality of internal clocks; and accessing data of the data signal transmitted from the memory according to the preferred clock.

The advantages and spirit related to the present disclosure can be further understood via the following detailed description and drawings.

DETAILED DESCRIPTION OF THE PREFERRED EMBODIMENT

Figure 1:
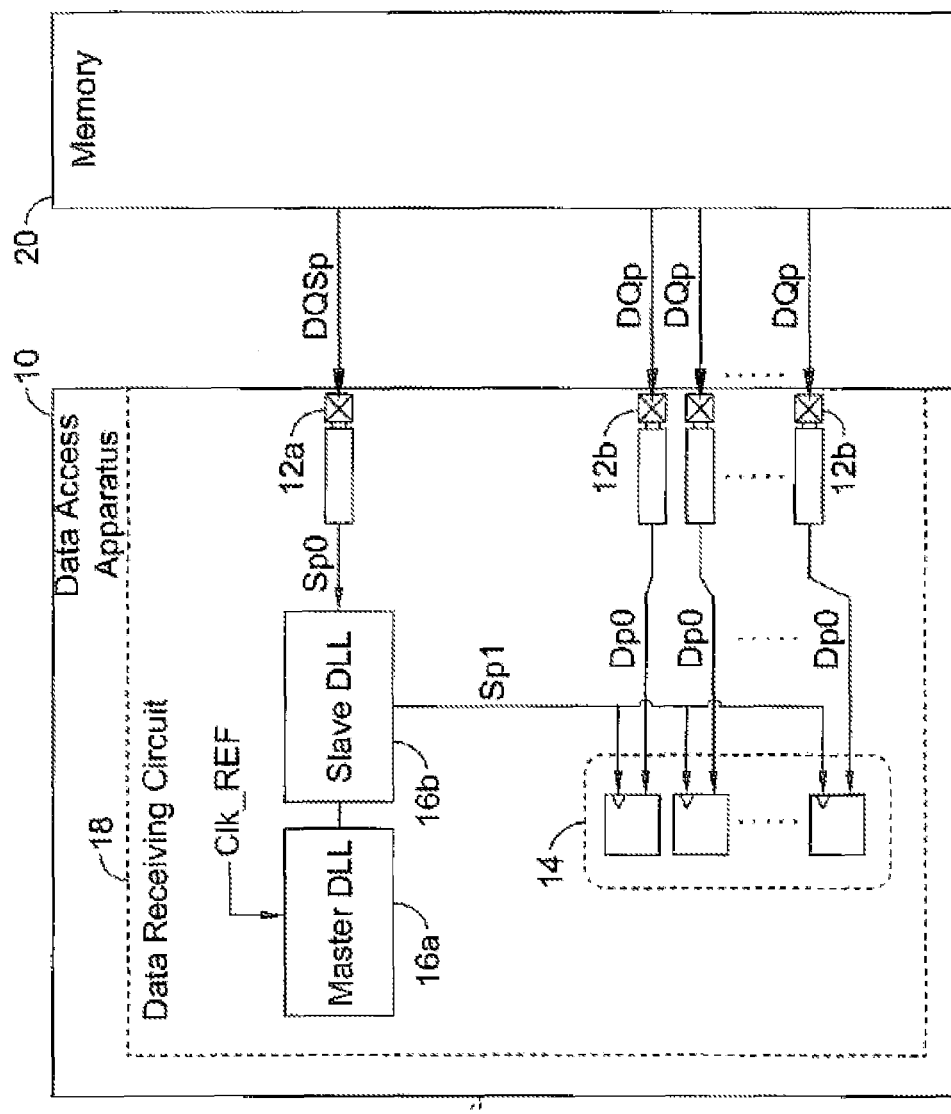
FIG. 1 is a block diagram of a typical data access apparatus accessing a memory via a known data receiving circuit.
Figure 1:
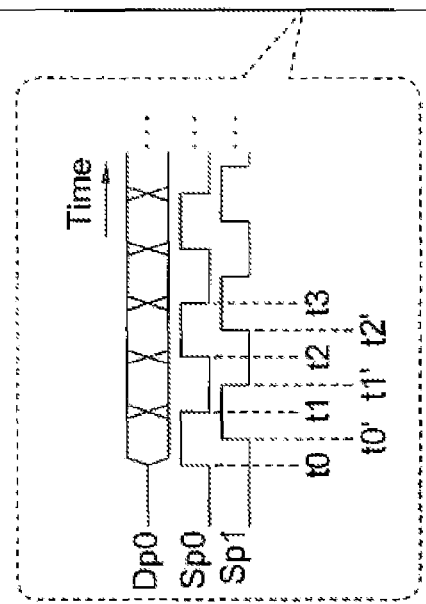

FIG. 1 shows a block diagram of a typical data access apparatus 10 used for accessing a memory 20 by a conventional data receiving circuit 18. The data access apparatus 10 is a chip, and the memory 20 is a DDR memory. When the data access apparatus 10 accesses (e.g., reads) data of the memory 20, the memory 20 provides a plurality of data signals DQp and a synchronous data strobe signal DQSp. Correspondingly, the data receiving circuit 18 comprises pads 12a and 12b. The pad 12a is used to receive the data strobe signal DQSp as a data strobe signal Sp0, and pads 12b are used to receive the data signals DQp as corresponding data signals Dp0.

The left part of FIG. 1 illustrates a timing relation between the data signals Dp0 and the data strobe signal Sp0. When the data signals Dp0 carry data after a time point t1, the data strobe signal is used as clock signals to synchronously indicate the timings of a plurality of data included in data signals. For example, when the data signals Dp0 carry another data at a time point t1, the data strobe signal Sp0 change its power level to indicate a data transition of the data signal. Likewise, at time points t2 and t3, power level transitions of the data strobe signal Sp0 synchronously indicate data transitions of the data signals Dp0. In other words, the data strobe signal Sp0 and the data signals Dp0 (or the data strobe signal DQSp and the data signals DQp) are in-phase. The transitions of the data strobe signal are aligned with transitions of data signals.

However, as conventional in the prior art, upon accessing data of the data signals Dp0, the data receiving circuit 18 samples data of the data signals Dp0 by a latching module 14. The latching module 14 comprises a plurality of flip-flop elements and is triggered to sample data of the data signals Dp0 according to a signal Sp1. The signal Sp1 is generated according to the data strobe signal Sp0 in the conventional data receiving circuit 18. However, although the data strobe signal Sp0 and the data signals Dp0 are in-phase, the data of the data signals Dp0 are preferably sampled and read at the middle timing between two transitions of the data signals Dp0. In other words, there is a phase difference of 90 degrees between the signal Sp1 used for sampling and the data strobe signal Sp0.

Therefore, the data receiving circuit 18 further comprises a DLL for delaying the data strobe signal Sp0 by 90 degrees to generate the signal Sp1 used for sampling the data signals Dp0. The left part of FIG. 1 illustrates the preferred timing of the signal Sp1, of which signal transitions (e.g., time points t0', t1' and t2') in the middle position between two continuous transitions of the data strobe signal Sp0.

In the prior art shown in FIG. 1, the foregoing DLL is a two-stage master-slave DLL comprising a master DLL 16a and a slave DLL 16b. The master DLL 16a provides a control voltage to the slave DLL 16b according to a reference clock Clk_REF so as to provide the delay of 90 degrees. Since the two-stage master-slave DLL 16a/16b has a complicated circuit structure, a large layout area, a complicated operation flow and large power consumption. In addition, the data strobe signal DQSp/Sp0 is a bi-directional signal but not a free-running clock. When the data signals DQp/Dp0 carry data bits, transitions of the data signals are indicated according to level transitions of the data strobe signal DQSp/Sp0; when the data signals DQp/Dp0 does not carry data bits, power levels of the data strobe signal DQSp/Sp0 stays unchanged (e.g., before the time point t0)○ When the data signal DQp/Dp0 begins carrying the data bits, the DLL 16a/16b need to immediately overcome the transition status and stabilizes operations to stably in time delay the data strobe signal Sp0 by 90 degrees. However, as the requirements of high-speed data access/exchange increases day by day, the data transmission frequency grows faster and faster, and the DLL 16a/16b becomes harder and harder to respond in time, i.e., the DLL 16a/16b stabilizes operations only after the transition status lasting for several cycles (i.e., a time period of a plurality of data). However, during the transition status period, the data receiving circuit 18 in FIG. 1 cannot accurately samples actual content of the data bits. For the DDR memory continuously transmits a plurality of data bits in a same signal in a burst mode, undesired effects of the foregoing disadvantage become more obvious.

Figure 2:
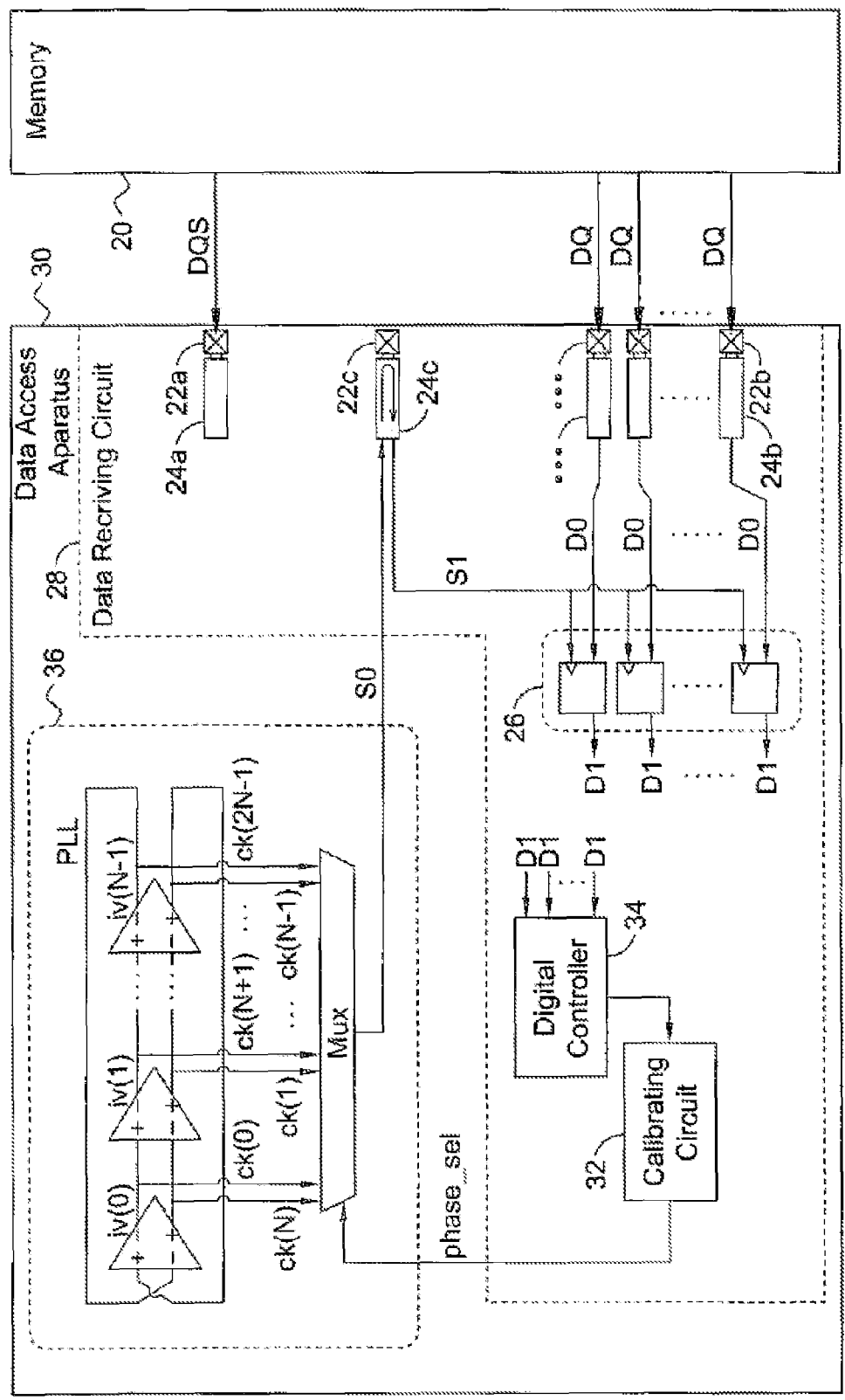
FIG. 2 is a block diagram of a data access apparatus accessing a memory via a data receiving circuit in accordance with an embodiment of the present disclosure.

FIG. 2 is a block diagram of a data access apparatus 30 and a memory 20 in accordance with the present disclosure. The memory 20 may be a single data rate memory, eg. DDR memory. The data access apparatus 30 is a central processing unit (CPU), an integrated circuit (IC), an ASIC or an SOC, for accessing the memory 20. When the data access apparatus 30 accesses (or reads) data of the memory 20, the memory 20 provides a plurality of data signals DQ and a synchronous data strobe signal DQS. As mentioned in FIG. 1, the data strobe signal DQS and the data signals DQ are in-phase, i.e., transitions of the data signals DQ and transitions of the data strobe signal DQS are synchronous and simultaneously occur.

Corresponding to the data strobe signal DQS and the data signals DQ provided by the memory 20, the data receiving circuit 28 comprises pads 22a and 22b and corresponding input/output (I/O) circuits 24a and 24b. The pads 22a and 22b are I/O pads, and the I/O circuits 24a and 24b respectively comprise a buffer, an electrostatic discharge (ESD) protection circuit. The pad 22a and the I/O circuit 24a are for receiving the data strobe signal DQS, and the pads 22b and the I/O circuits 24b are used for receiving data signals DQ and for outputting data signals D0. In addition, the data receiving circuit 28 comprises a latching module 26 for sampling the data signals D0 to generate data D1 according to a clock 51.

One of most important aspects of the present disclosure is that, when sampling is triggered, the data access apparatus 30 uses internal clocks instead of an external data strobe signal DQS (e.g., provided by the external memory 20) to overcome the disadvantages caused by the two-stage master-slave DLL 16a/16b in FIG. 1. According to the present disclosure, the data receiving circuit 28 comprises a digital controller 34 and a calibrating circuit 32, which are operated with an internal PLL 36 in the data access apparatus 30. The PLL 36 generates a plurality of clocks ck(0), ck(1), . . . , which have the same frequency but different phases, as the internal clocks. The calibrating circuit 32 determines a preferred clock from the plurality of internal clocks without referring to the data strobe signal DQS provided by the external memory 20, so that the latching module 26 samples and accesses data of the data signals D0 according to triggering of the preferred clock.

Generally, a current data access apparatus comprises internal PLLs for providing clocks for operating the data access apparatus. According to the present disclosure, the clocks provided by the internal PLLs replace the data strobe signal DQS provided by the memory 20. As shown in FIG. 2, the PLL 36 comprises a ring oscillator that is formed by a plurality of bi-directional differential inverters iv(0), iv(1) to iv(N−1) (where N is a constant). The ring oscillator has differential output ends for respectively providing phase-inverted clock pairs ck(0)/ck(N), ck(1)/ck(N+1) to ck(N−1)/ck(2N−1), and the like. The clocks are the same frequency but different phases, and are used for controlling an operating timing (including operating timings of the calibrating circuit 32 and the digital controller 34) of the data access apparatus 30. One of the clocks is selected by a multiplexer Mux as a strobe clock to the latching module 26.

More specifically, the calibrating circuit 32 is described below. The calibrating circuit 32 is operated in a training mode or a normal mode. When the calibrating circuit 32 operates in the training mode, a phase selection signal phase_sel is implemented to control the multiplexer Mux to in sequence select a clock ck(n) from the plurality of internal clocks ck(0), ck(1) to ck(2N−1), wherein n is a number between 0 and 2N−1, so that the latching module 26 samples/ latches a training data according to the strobe clock ck(n). The digital controller 34 matches the training data with a predetermined data to generate a matching result, and transmits the matching result to the calibrating circuit 32, so that the calibrating circuit 32 determines a clock S1 according to the matching result. The training data of the training signal is provided by the memory 20 according to an instruction of the data access apparatus 30 (or, specifically, the data receiving circuit 28). That is, the training signal is transmitted to the data receiving circuit 28 by a data signal DQ/D0. Sampling data of the training signal according to the strobe clock ck(n) by the latching module 26 is transmitted to the digital controller 34 by a data D1.

Selection of the preferred clock is further described below. The latching module 26 samples the training signal to generate a training data according to a strobe clock ck(n), If the digital controller 34 determines that the training data matches with a predetermined data, it means that the training data of the training signal can be accurately sampled according to the strobe clock ck(n). Therefore, the strobe clock ck(n) is regarded as a candidate clock as the preferred clock, and the calibrating circuit 32 uses the strobe clock ck(n) as a candidate clock. The calibrating circuit 32 determines one or more candidate clocks from the internal clocks (ck(0) to ck(2N−1)) by respectively matching the training data sampled according to the internal clocks (ck(0) to ck(2N−1)) with the predetermined data. If there are a plurality of candidate clocks, the calibrating circuit 32 selects a preferred clock having a middle phase from the candidate clocks. For example, the phase of the preferred clock is between a maximum phase and a minimum phase of all candidate clocks, such that the preferred clock and the data signal D0 are out-of-phase. Therefore, there is a phase difference (i.e., delay) approximating 90 degrees between the preferred clock and the data signal D0, such that transitions of the preferred clock in fact approximate middle transitions of the data signals/the data strobe signal.

The calibrating circuit enters the training mode and determines the preferred clock from the plurality of internal clocks when the data access apparatus 30/the data receiving circuit 28 is powered on. Then the calibrating circuit 32 (and the data receiving circuit 28) operates in the normal mode at the preferred clock selected by the multiplexer Mux according to the phase selection signal phase_sel. Therefore, the latching module 26 latches data signals DQ/D0 transmitted from the memory 20 at the preferred clock, and accurately samples/reads data carried in the data signals. According to the present disclosure, clocks for sampling need not be generated according to the external data strobe signal DQS, and the data receiving circuit need not configure the DLL 16a/16b in FIG. 1 either to avoid the disadvantages of the conventional structure in FIG. 1.

For a practical access interface, when the external data strobe signal is replaced by the internal preferred clock, the data access apparatus of the present disclosure further comprises a dummy pad 22c and a corresponding I/O circuit 24c, coupled between the PLL 36 and the latching module 26, for transmitting a strobe clock S0 selected by the calibrating circuit 32 as the clock 51 to the latching module 26. The dummy pad 22c is an I/O pad. In such an arrangement, regardless of the training mode or the normal mode, the clocks provided by the PLL 36 are transmitted via a loop back path of the dummy pad 22c/the I/O circuit 24c to simulate an effect that the external data signal/data strobe signal is transmitted to the data receiving circuit 28 via a pad/an I/O circuit, e.g., the effect is a load or delay effect. However, when the memory 20 is received (or read) according to the present disclosure, the data strobe signal DQS need not be practically implemented to a read process.

Figure 3:
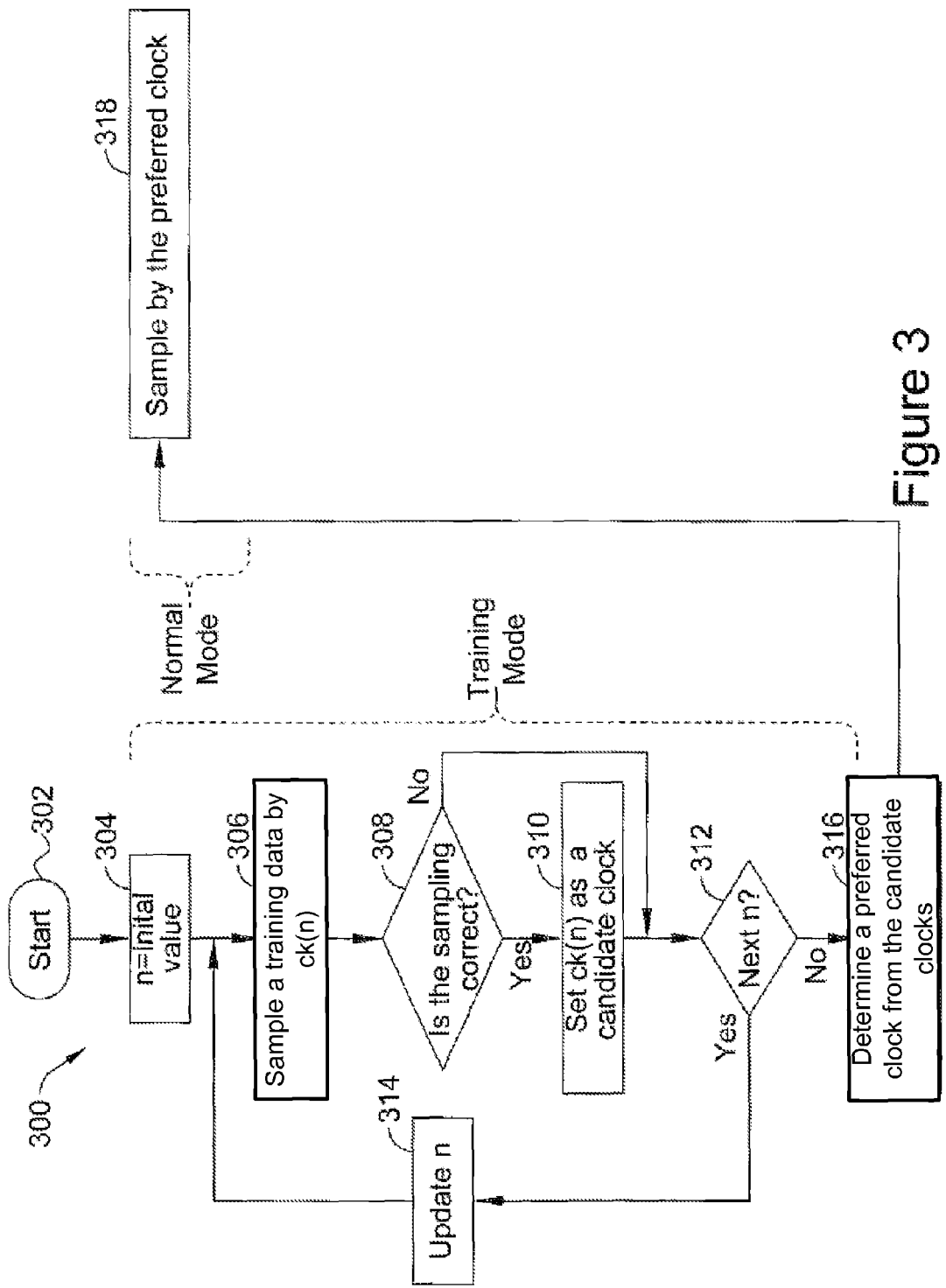
FIG. 3 is a flow chart of a data receiving circuit in accordance with an embodiment of the present disclosure.

To continue with the embodiment in FIG. 2, FIG. 3 shows a flow 300 of accessing by the data access apparatus 30 the memory 20 by the data receiving circuit 28 in accordance with an embodiment of the present disclosure. The flow 300 comprises steps below. The flow 300 begins with Step 302. The data access apparatus 30/the data receiving circuit 28 (in FIG. 2) is powered on and enters the training mode. In Step 304, an initial value of n is set for testing all internal clocks ck(n) generated by the PLL 36. In Step 306, a training data of a training signal is sampled by the latching module is according to a selected internal clock ck(n). More specifically, the data access apparatus 30 (and the data receiving circuit 28) transmits an instruction, so that the memory 20 transmits the training data of the training signal back to the data access apparatus 30 by a data signal DQ. The calibrating circuit 32 controls the multiplexer Mux to select the internal clock ck(n) according to a phase selection signal phase_sel. Through transmission of the I/O circuit 24c/24b and the pad 22c/22b, the latching module samples a data signal D0 corresponding to the training data according to a clock 51 corresponding to the clock ck(n) so as to respond a sampling result of the training data in a data D1. In Step 308, match the data D1 with the predetermined data. If the data D1 and the predetermined data are a good match, it means that the data can be accurately sampled according to the clock ck(n), and the flow 300 proceeds to Step 310. If the data D1 and the predetermined data are not a good match, it means that the data cannot be accurately accessed according to the clock ck(n). Therefore, the clock ck(n) that is not qualified to replace a data strobe signal DQS is removed, and the flow 300 proceeds to Step 312. Step 308 is performed by the digital controller 34. In Step 310, the clock ck(n) is set as a candidate clock. In Step 312, check if there is another internal clock needed to be tested. If yes, the flow 300 proceeds to Step 314; if no, the flow 300 proceeds to Step 316. In Step 314, a value of n is updated, so that the flow 300 returns to Step 306 and another clock ck(n) is tested. Step 314 is performed by the calibrating circuit 32. In Step 316, select a preferred clock from the candidate clocks generated in Step 310. Step 316 is performed by the calibrating circuit 32. In an embodiment, when Step 310 is iterated for several times and a plurality of candidate clocks are obtained, the preferred clock is selected according to phases of the candidate clocks. The phase of the preferred clock is between a maximum phase and a minimum phase of the plurality of candidate clocks. When Step 316 ends, the flow 300 proceeds to Step 318, and enter a normal mode. In Step 318, in the normal mode, the calibrating circuit 32 samples data by the latching module 26 according to the preferred clock. That is, data access is performed according to the preferred clock without referring to an external data strobe signal (or a delay signal generated by delaying the external data strobe signal by 90 degrees).

In practice, perform a training procedure when the data access apparatus 30/the data receiving circuit 28 is powered on. And Step 304 to Step 316 do not significantly change an operating flow of the data access apparatus 30/the memory 20. In addition, in the foregoing flow 300, although the training mode is performed before the normal mode, the training mode may be again entered after the normal mode according to practical situations.

Figure 4:
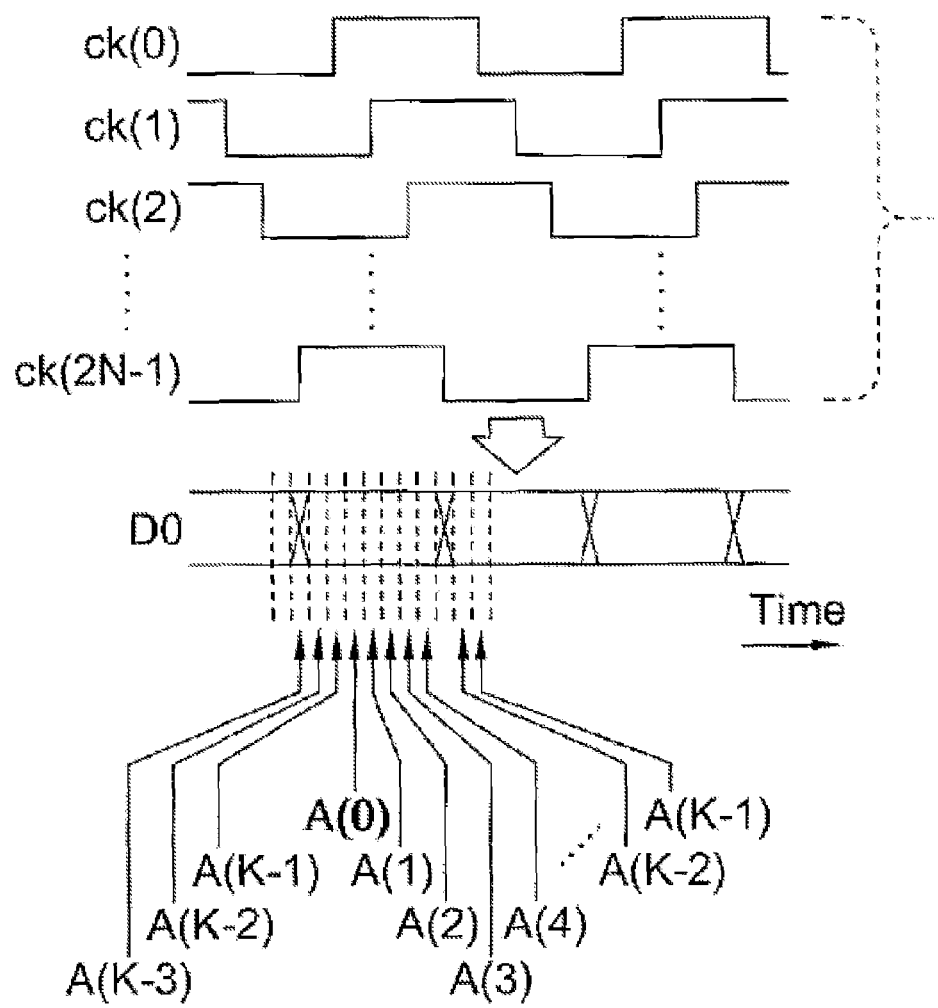
FIG. 4 is a timing diagram of selection of a preferred clock via the data receiving circuit in FIG. 2 in accordance with an embodiment of the present disclosure.

To continue with the embodiments in FIG. 2 and FIG. 3, FIG. 4 shows a schematic diagram of selection of a preferred clock under a training mode in accordance with an embodiment of the present disclosure. In FIG. 4, when the latching module 26 samples a data signal D0 according to internal clocks ck(0), ck(1) to ck(2N−1) provided the PLL 36 (in FIG. 2), it is equivalent that K corresponding sampling intervals A(0), A(1) to A(K−2) and A(K−1) (where K is a constant) respectively corresponding to internal clocks having different phases are periodically divided in a time axis, i.e., sampling of the data signal D0 via the latching module 26 during the internal A(0) is triggered by an internal clock corresponding to the internal A(0), and the like. In this embodiment, since the sampling intervals A(0) to A(4), A(K−2) to A(K−1) approximate centers of a plurality data of the data signal D0 (i.e., a central point of an eye diagram of the data signal D0), it means that the latching module 26 can accurately latch the data according to the internal clocks corresponding to the sampling intervals, such that the sampling intervals are regarded as candidate intervals and the corresponding clocks are candidate clocks. In practice, any candidate clock can be regarded as the preferred clock. For example, in the embodiment in FIG. 4, since the sampling interval A(1) is in the middle of the adjacently arranged candidate intervals, the sampling interval A(1) is regarded as a preferred sampling interval, and the internal clock corresponding to the sampling interval A(1) is selected as the preferred clock, meaning that the interval clock corresponding to the sampling interval A(1) is an intermediate phase of phases of other candidate clocks. In practice, since the memory 20 originally provides the data signals DQ and the data strobe signal DQS according to clocks provided by the data access apparatus 30, internal clocks of the data access apparatus 30/the data receiving circuit and the data strobe signal DQS/the data signals DQ have same frequencies. Therefore, provided that a preferred clock having a preferred phase is selected under the training mode, a data signal transmitted from the memory 20 can be accurately accessed under the normal mode according to the present disclosure.

In conclusion, compared to the prior art in which a data signal is sampled/accessed according to an external data strobe signal, a data access apparatus of the present disclosure uses a internal clock to replace the external data strobe signal, so as to trigger sampling and access of the data signal. A master-slave DLL has some disadvantages including complicated operations/structures, a large size configuration, great system resource consumption and a slow response speed. By implementing a digital calibrating circuit in the data access apparatus 30, we could overcome the above disadvantages and keep accurate and high-speed data access performance. Since the internal clocks are free-running clocks, the data access apparatus 30 cannot be undesirably affected by a data strobe signal. The digital controller 34 and the calibrating circuit 32 (in FIG. 2) could be realized by hardware, software or firmware. The PLL 36 is illustrated by taking a ring oscillator formed by a different inverter as an example in FIG. 2; however, the ring oscillator is also formed by an odd number of single-directional or bi-directional inverters for providing a plurality of clocks having a same frequency and different phases as internal clocks. The PLL 36 is also equivalent to other types of clock generating circuits providing numerous clocks having same frequencies and different phases. In addition, although the memory 20 (or the DDR memory) is taken as an example in FIG. 2 to FIG. 4, other types of data exchange interfaces, especially data exchange interfaces having data strobe signals together with data signals, are also within the spirit of the present disclosure. The memory 20 is regarded as a data transmission end, and the data access apparatus 30 is regarded as a data receiving end.

While the present disclosure has been described in terms of what is presently considered to be the most practical and preferred embodiments, it is to be understood that the present disclosure needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A data access apparatus, for accessing a memory that provides a data signal to the data access apparatus, the data access apparatus comprising:
a phase locked loop (PLL) that provides a plurality of internal clocks and selects a strobe clock from the plurality of internal clocks according to a phase selection signal; and
a data receiving circuit coupled to the PLL, the data receiving circuit comprising:
a latching module that latches the data signal according to a plurality of triggers of the strobe clock; and
a calibrating circuit that generates the phase selection signal for comparing a training data with a predetermined data in response to the plurality of internal clocks in a training mode, and determines whether the phase selection signal corresponds to a preferred clock in a normal mode.

2. The data access apparatus as recited in claim 1, wherein the data access apparatus enters the normal mode from the training mode when the calibrating circuit determines that the phase selection signal corresponds to the preferred clock.

3. The data access apparatus as recited in claim 1, wherein the PLL provides the strobe clock from the plurality of internal clocks in sequence according to the phase selection signal in the training mode and the PLL provides the strobe clock from the plurality of internal clocks when the phase selection signal corresponds to the preferred clock as determined by the calibrating circuit in the normal mode.

4. The data access apparatus as recited in claim 3, wherein the data receiving circuit further comprises:
a digital controller that matches the training data with the predetermined data to generate according to plurality of matching results at the plurality of internal clocks in the training mode;
wherein the calibrating circuit determines whether the phase selection signal corresponds to the preferred clock according to the plurality of matching results.

5. The data access apparatus as recited in claim 4, wherein the calibrating circuit records the strobe clock as a candidate clock if the matching results show the training data and the predetermined data are a good match.

6. The data access apparatus as recited in claim 5, wherein the calibrating circuit determines the preferred clock according to phases of the candidate clocks.

7. The data access apparatus as recited in claim 3, wherein the calibrating circuit enters the training mode when the data receiving circuit is powered on.

8. The data access apparatus as recited in claim 3, wherein the data receiving circuit provides an instruction to the memory that provides the training data of a training signal in the training mode.

9. The data access apparatus as recited in claim 1, wherein the plurality of internal clocks have a same frequency but different phases.

10. The data access apparatus as recited in claim 1, wherein the preferred clock is a free-running clock.

11. A method of accessing a memory that provides a data signal, the method comprising:
- providing a plurality of internal clocks;
- selecting a clock from the plurality of internal clocks; and
- accessing data contained in the data signal transmitted from the memory according to the selected clock, wherein the method further comprising:
- entering a training mode before a preferred clock is determined;
- selecting a strobe clock from the plurality of internal clocks in sequence;
- respectively accessing a training data contained in a training signal according to the strobe clock; and
- entering a normal mode when the training mode ends, to determine one of the internal clocks as the preferred clock.

12. The method as recited in claim 11, further comprising:
- matching the accessed training data with a predetermined data according to each of the plurality of internal clocks to generate a plurality of matching results; and
- determining the preferred clock according to the plurality of matching results.

13. The method as recited in claim 11, further comprising:
- determining the strobe clock as a candidate clock if the accessed training data and a predetermined data are a good match; and
- determining the preferred clock from the candidate clocks.

14. The method as recited in claim 13, wherein determining the preferred clock from the candidate clocks comprises:
- determining the preferred clock according to phases of the candidate clock.

15. The method as recited in claim 11, wherein entering the training mode comprises entering the training mode when powered on.

16. The method as recited in claim 11, further comprising:
- controlling the memory to provide the training data of the training signal in the training mode.

17. The method as recited in claim 11, wherein the plurality of internal clocks have a same frequency but different phases.

18. The method as recited in claim 11, wherein the plurality of internal clocks are provided by a phase locked loop (PLL).

19. The method as recited in claim 11, wherein the preferred clock is a free-running clock.

* * * * *